United States Patent
Düsberg et al.

(10) Patent No.: US 10,546,712 B2
(45) Date of Patent: Jan. 28, 2020

(54) DEVICE FOR GENERATING A SOURCE CURRENT OF CHARGE CARRIERS

(71) Applicant: KETEK GmbH, Munich (DE)

(72) Inventors: Felix Düsberg, Munich (DE); Michael Bachmann, Munich (DE)

(73) Assignee: KETEK GmbH, Munich (DE)

( * ) Notice: Subject to any disclaimer, the term of this patent is extended or adjusted under 35 U.S.C. 154(b) by 215 days.

(21) Appl. No.: 15/843,919

(22) Filed: Dec. 15, 2017

(65) Prior Publication Data

US 2018/0174792 A1    Jun. 21, 2018

(30) Foreign Application Priority Data

Dec. 16, 2016  (DE) .................. 10 2016 124 673

(51) Int. Cl.
| | |
|---|---|
| H05G 1/30 | (2006.01) |
| H01J 35/06 | (2006.01) |
| H01J 29/96 | (2006.01) |
| H01J 29/62 | (2006.01) |
| H01J 35/14 | (2006.01) |

(Continued)

(52) U.S. Cl.
CPC .............. *H01J 29/96* (2013.01); *H01J 29/62* (2013.01); *H01J 35/065* (2013.01); *H01J 35/14* (2013.01); *H01J 37/073* (2013.01); *H01J 37/08* (2013.01); *H05G 1/34* (2013.01)

(58) Field of Classification Search
None
See application file for complete search history.

(56) References Cited

U.S. PATENT DOCUMENTS 4,427,886 A * 1/1984 Martin ................. H01J 37/073
                                                     250/310
5,173,634 A   12/1992 Kane
(Continued)

FOREIGN PATENT DOCUMENTS

| DE | 112014002139 B4 | 5/2017 |
|---|---|---|
| WO | 2014124041 A2 | 8/2014 |

OTHER PUBLICATIONS

Bachmann, M., et al., "CMOS field emission devices based on {111} silicon surfaces," Journal of Vacuum Science & Technology B, Nanotechnology and Microelectronics: Materials, Processing, Measurement, and Phenomena, vol. 32, Issue 2, Jan. 2014, pp. 1-2.

*Primary Examiner* — Thomas R Artman
(74) *Attorney, Agent, or Firm* — Slater Matsil, LLP

(57) ABSTRACT

A device for generating a source current of charge carriers by a field emission and a method stabilizing a source current of charge carriers emitted by a field emission element are disclosed. In an embodiment the device includes at least one field emission element from which the charge carriers emerge during operation, which lead to an emission current in the field emission element, at least one extraction electrode in order to extract the charge carriers from the field emission element, wherein a first part of the extracted charge carriers contributes to the source current, and a second part of the extracted charge carriers impinges on the extraction electrode and leads to an extraction current in the extraction electrode, an additional electrode on which the source current of charge carriers impinges at least in part and which contributes to an electrode current in the additional electrode.

18 Claims, 9 Drawing Sheets

(51) Int. Cl.
  *H05G 1/34* (2006.01)
  *H01J 37/073* (2006.01)
  *H01J 37/08* (2006.01)

(56) References Cited

U.S. PATENT DOCUMENTS

| | | | |
|---|---|---|---|
| 5,847,408 A | 12/1998 | Kanemaru et al. | |
| 6,084,245 A * | 7/2000 | Hsu | H01J 3/022 257/10 |
| 6,168,491 B1 * | 1/2001 | Hsu | H01J 9/025 445/24 |
| 6,440,763 B1 * | 8/2002 | Hsu | B82Y 10/00 438/20 |
| 6,448,701 B1 * | 9/2002 | Hsu | B82Y 10/00 313/309 |
| 6,492,781 B2 | 12/2002 | Palmer et al. | |
| 6,595,820 B2 * | 7/2003 | Hsu | B82Y 10/00 313/309 |
| 8,177,987 B2 * | 5/2012 | Nozu | H01J 1/3046 216/13 |
| 8,766,542 B2 * | 7/2014 | Cho | H01J 37/073 315/108 |
| 9,230,776 B2 * | 1/2016 | Matsumoto | H01J 37/3171 |
| 9,293,293 B2 * | 3/2016 | Watanabe | H01J 37/065 |
| 9,570,268 B2 | 2/2017 | Imai et al. | |
| 9,748,071 B2 * | 8/2017 | Guerrera | H01J 37/065 |
| 2002/0125805 A1 * | 9/2002 | Hsu | B82Y 10/00 313/309 |
| 2002/0130625 A1 | 9/2002 | Palmer et al. | |
| 2002/0190622 A1 * | 12/2002 | Hsu | B82Y 10/00 313/309 |
| 2010/0159783 A1 * | 6/2010 | Nozu | H01J 1/3046 445/24 |
| 2010/0159784 A1 * | 6/2010 | Tomii | H01J 1/3046 445/24 |
| 2013/0200788 A1 * | 8/2013 | Cho | H01J 37/073 315/1 |
| 2014/0197336 A1 * | 7/2014 | Watanabe | H01J 37/065 250/492.3 |
| 2015/0262790 A1 * | 9/2015 | Matsumoto | H01J 37/3171 250/395 |
| 2015/0371810 A1 * | 12/2015 | Guerrera | H01J 37/065 250/396 R |
| 2018/0174792 A1 * | 6/2018 | Dusberg | H01J 37/243 |

\* cited by examiner

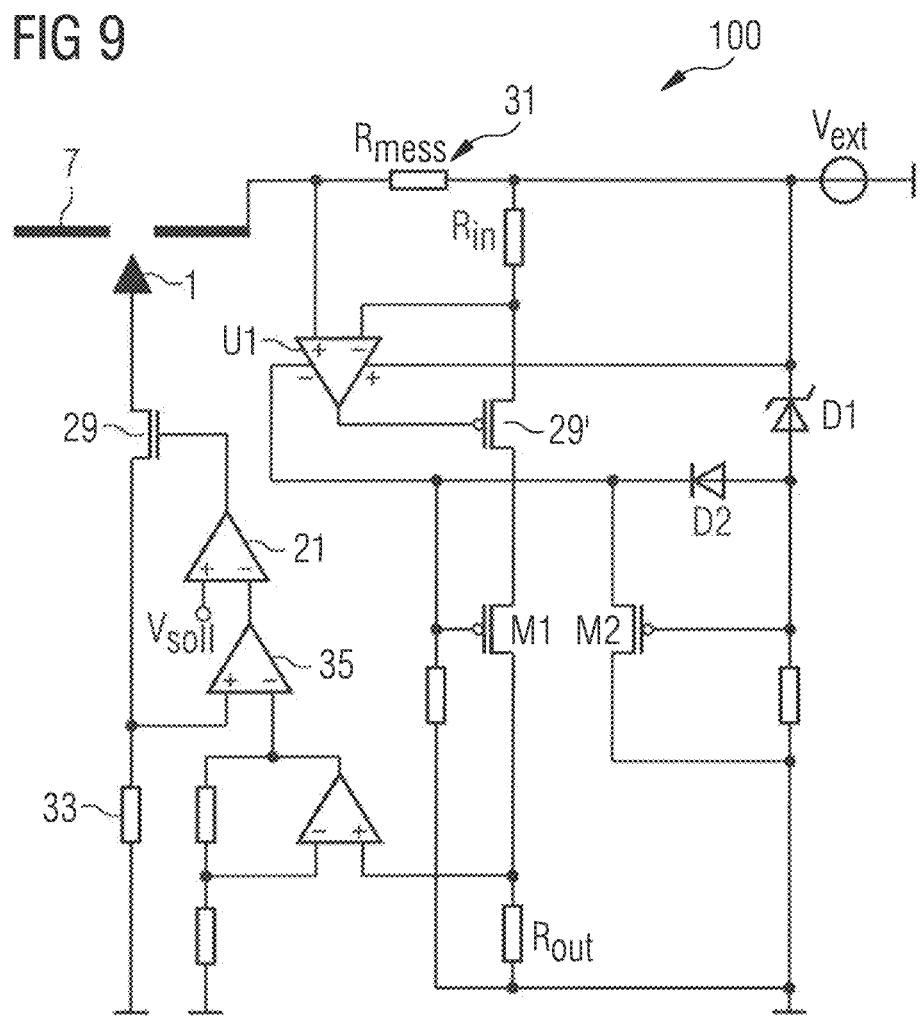

DEVICE FOR GENERATING A SOURCE CURRENT OF CHARGE CARRIERS

CROSS-REFERENCE TO RELATED APPLICATIONS

This application claims the benefit of German patent application 10 2016 124 673.5, filed on Dec. 16, 2016, which application is hereby incorporated herein by reference.

TECHNICAL FIELD

The invention relates to a device for generating a source current of charge carriers by means of field emission. The invention further relates to a method for stabilizing a source current of charge carriers emitted by means of a field emission element.

SUMMARY

Embodiments of the invention provide a device by means of which a source current of charge carriers can be generated in a temporally stable manner.

According to at least one embodiment, the device for generating a source current of charge carriers is set up by means of field emission or field ionization. For the sake of simplicity, only field emission is referred to in the following text, but the statements relating thereto equally apply to the field ionization. In other words, the device described here is suitable as a field emission element and also as a field ionization source. The charge carriers are in particular electrons or ions.

According to at least one embodiment, the device comprises one or more field emission elements. The charge carriers emerge from the at least one field emission element during operation of the device. The emitted charge carriers lead to an emission current in the field emission element. The field emission element is, for example, one or more emitters. These can be in particular tips, for example, from a semiconductor such as silicon, a metal such as tungsten, an insulator such as silicon oxide or silicon nitride, a carbon-based material such as diamond-like carbon, carbon nanotubes, graphene or other materials such as $LaB_6$, to which an extraction voltage is applied. The field emission element is preferably connected as a most positive or most negative electrode, for example, as a cathode.

According to at least one embodiment, the device comprises at least one extraction electrode for applying the extraction voltage, in order to extract the charge carriers from the field emission element. The extraction electrode or electrodes are, for example, a ring electrode or a grid electrode.

According to at least one embodiment, a first part of the extracted charge carriers contributes to the source current and a second part of the extracted charge carriers impinges on the extraction electrode and leads to an extraction current in the extraction electrode. In other words, a part of the charge carriers emitted by the field emission element can strike the extraction electrode and be absorbed by the extraction electrode, so that these absorbed charge carriers are not further part of the source current.

According to at least one embodiment, the device comprises at least one control device. The control device is set up to reduce fluctuations in a controlled variable Q characteristic for the source current during operation of the device. The controlled variable Q is, for example, a current at the extraction electrode (extraction current) and/or at the field emission element (emission current) and/or at an additional electrode (electrode current) and/or at each further electrode on which the charge carriers preferably impinge in order to generate an electromagnetic radiation such as x-ray radiation after passing through the extraction electrode. It is possible to determine the characteristic control variable Q by the current in the additional electrode (electrode current). The additional electrode is preferably the most positive electrode or the most negative electrode, depending on whether electrons or positive ions are generated.

The additional electrode is not necessarily a metallic electrode or electrode in the conventional sense. Thus, it is possible for the additional electrode to be, for example, a housing, which actually does not belong to the circuitry and is not intended as an electrode. Alternatively or additionally, the additional electrode is a medium in which the extracted charge carriers are to be used. The medium can be a solid, a liquid or a gas. This is, for example, a lacquer for an electron beam lithography or a gas onto which the charge carriers strike. In particular, if such a medium or a component such as a housing has a sufficient electrical conductivity and is coupled or connected to the electrical interconnection, it can be tested by means of such an additional electrode whether the charge carrier current is constant and/or a regulation to the charge carrier current is possible.

However, the additional electrode is preferably an electrode in the conventional sense, which in particular is integrated in the electrical interconnection in a fixed and intended manner and which is preferably made of one or more metals.

According to at least one embodiment, the device is set up for generating radiation. In this case, a photon flux in the radiation generation is preferably proportional or approximately proportional to the electrode current in the additional electrode.

In at least one embodiment, the device is used to generate a source current of charge carriers by means of field emission. The device comprises at least one field emission element from which the charge carriers emerge during operation of the device, which lead to an emission current in the field emission element. In addition, the device comprises at least one extraction electrode for applying an extraction voltage in order to extract the charge carriers from the field emission element. In this case, a first part of the extracted charge carriers contributes to the source current and a second part of the extracted charge carriers impinges on the extraction electrode and leads to an extraction current in the extraction electrode. A control device of the device is set up, during operation of the device, to reduce fluctuations in a controlled variable Q characteristic of the source current.

It has been found that the source current of charge carriers generated by similar devices has relatively strong fluctuations. These fluctuations can be reduced by controlling the control variable Q in the device described here.

According to at least one embodiment, the device comprises at least one control element. The control element or elements are configured to change the emission current. In this case, the control device is preferably set up to control the control element.

According to at least one embodiment, the device comprises at least one variation electrode which is set up to change a kinetic energy of the extracted charge carriers of the source current by means of a variation voltage applied to the variation electrode. In particular, the device is designed so that the variation voltage is varied as a function of a variable K characteristic of the kinetic energy of the extracted charge carriers. For example, the characteristic variable K is a voltage difference between the field emission element and the variation electrode. Such a variation electrode can be provided as an alternative or in addition to the additional electrode, which preferably serves as a most positive or most negative electrode.

According to at least one embodiment, the control element controls the emission current. In particular, the control element controls the charge carrier flow to the field emission element or the extraction voltage. For example, the control element changes the emission current by changing a resistance and/or a voltage, in particular towards the field emission element, through the control of a transistor or illumination or temperature application of a diode or of a transistor. The control element can also be integrated into the field emission element.

In a particularly preferred embodiment, the device for generating a source current of charge carriers by means of field emission comprises at least one field emission element, from which charge carriers are discharged during operation of the device, which lead to an emission current in the field emission element and contribute at least partly to the source current of charge carriers. In addition, the device comprises at least one control element which is set up to change the emission current, and comprises at least one control device, wherein the control device is designed to control the control element. Furthermore, at least one variation electrode is provided, which is set up to change the kinetic energy of the extracted charge carriers of the source current by means of a variation voltage applied to the variation electrode. The device is designed in such a way that the variation voltage can be varied as a function of a characteristic variable K which is characteristic for the kinetic energy of the extracted charge carriers.

According to at least one embodiment, the characteristic variable K can be obtained by means of a voltage drop on the control element. The device is preferably designed in such a way that, when the voltage drop at the control element increases, the variation voltage is increased and/or the variation voltage is reduced when the voltage drop at the control element decreases. In other words, it is possible for the characteristic variable K to be measured by means of the voltage drop at the control element.

According to at least one embodiment, the device comprises one or more adding elements. The at least one adding element is electrically conductively connected to the variation electrode. The device is preferably designed in such a way that the variation voltage is obtained by means of addition of the extraction voltage and the voltage drop at the control element.

According to at least one embodiment, the voltage drop at the control element leads to a widening of the distribution of the kinetic energy of the charge carriers of the source current. This widening is preferably counteracted by means of the variation electrode.

According to at least one embodiment, the device comprises a ground connection and/or an electric supply power source, a power source for short. The control element is arranged in a conducting path between the supply power source and the field emission element. Alternatively, the control element is arranged in a conducting path between the ground connection and the field emission element.

According to at least one embodiment, the control element is a transistor, in particular a metal oxide semiconductor field effect transistor, MOSFET for short, and/or a diode, in particular a PIN diode, in particular a silicon drift detector, which is operated as a diode. Furthermore, bipolar transistors and/or IGBTFETs can be used for the control element. It is possible for the control element to control the charge carrier flow in the emitter via an electrically conductive connection to the emitter.

According to at least one embodiment, the control element is electrically conductively connected to the extraction electrode. The control element is then preferably designed to change the emission current by changing the extraction voltage.

According to at least one embodiment, the device is designed in such a way that during operation of the device a temporal distribution of the variable Q characteristic of the source current has a relative standard deviation SQ, which is less than or equal to one of the following values: 10%, 5%, 1%, 0.5%, 0.1%, 0.005%, 0.01%, 0.005%, 0.001%. This can result in the emission current becoming unstable or more stable by the device. The variable which is characteristic of the source current is, for example, a current at the most positive or most negative electrode.

According to at least one embodiment, the control device has at least one input to which a current value of the controlled variable is supplied, and at least one output which is connected to the control element. The device is preferably designed such that the control element is controlled via the precisely one output in particular, so that the control variable assumes a predetermined target value. In this case, the desired value can be constant or can change over time. The control variable can also be temporally modulated.

According to at least one embodiment, the device has at least one subtraction element. In this case, Q is preferably a function of the difference between the emission current and the extraction current. The difference can also be a voltage drop at the respective detection element, for example, voltage drops across a resistor through which the associated current flows.

According to at least one embodiment, Q is a function of an electrode current in the additional electrode, said electrode current results from charge carriers from the source current which strike the additional electrode.

According to at least one embodiment, the device has one or more additional electrodes, on which the source current of charge carriers impinges and contributes to an electrode current in the additional electrode. In this case, the controlled variable Q is preferably a function of the electrode current at this additional electrode, which is in particular a most positive or most negative electrode.

According to at least one embodiment, the device has one or more charge carrier optics. By means of the at least one charge carrier optical system, a flight path and/or a kinetic energy of the generated charge carriers can be influenced and/or controlled. Alternatively or additionally, a variation electrode is provided.

In the determination of the controlled variable Q, it is possible to consider an electric current, caused by charge carriers absorbed by the additional electrode and/or the charge carrier optics. Thus, the control variable Q is in particular the emission current, reduced by the extraction current and reduced by a current at the charge carrier optics and reduced by a current at the additional electrode and reduced by a current at the variation electrode. The control variable Q is alternatively formed by the emission current, reduced by any desired combination of a part of the applied electrodes.

According to at least one embodiment, the device is designed as a radiation source. In this case, the electromagnetic radiation to be emitted by the radiation source is generated by means of the source current striking the additional electrode. This means that, on the one hand, braking radiation is produced by the loss of kinetic energy of the charge carriers and, on the other hand, by the charge carriers in particular electrons in a material of the additional electrode are raised to higher energy levels, and when the electrons fall back into the original energy levels, the radiation is generated. The generated radiation is in particular electromagnetic radiation in a wavelength range from hard x-ray radiation to infrared radiation. For example, the generated radiation is x-ray radiation, approximately with an average photon energy of at least 5 keV or 20 keV or 60 keV and/or of at most 250 keV or 120 keV or 30 keV.

According to at least one embodiment, the device is designed as a charge carrier source. The charge carriers are, in particular, electrons or ions which originate from the field emission or field ionization element. The secondary electrons can likewise be secondary electrons from the additional electrode or ions, for example, from a gas volume, into which the source current enters and generates the ions by means of impact ionization.

According to at least one embodiment, one or more of the following components of the device for the source current are designed to be fully transmissive or partially transmissive, so that during operation of the device the charge carriers of the source current can pass through this component or through these components: the additional electrode, the variation electrode, the charge carrier optics. It is also possible for the additional electrode to form the variation electrode, so that both components can be identical.

According to at least one embodiment, the device comprises an arbitrarily selected plurality of or all of the following current sensing elements: emission current detection element, extraction current detection element, electrode current detection element, charge carrier optical current detecting element, variation electrode current detecting element. In this case, one of the current sensing elements comprises, for example, at least one resistor, wherein the voltage drop across the resistor or the resistors characterizes the current of the corresponding electrode.

According to at least one embodiment, in the device one, an arbitrarily selected plurality of or all of the following current sensing elements comprises a temperature compensation: extraction current detection element, emission current detection element, electrode current detection element, charge carrier optical current detection element, variation electrode current detection element. In this case, one, a preferably selected plurality of or all of the current sensing elements preferably comprises a plurality of resistors connected in series. One of the resistors can be a PTC resistor and alternatively or additionally, another of the resistors is an NTC resistor. PTC stands for positive temperature coefficient, and a material for this is, for example, a semiconducting, polycrystalline ceramic. NTC stands for negative temperature coefficient, for example, the NTC resistor is composed of a wire, for example, from a platinum alloy or from nickel and iron.

According to at least one embodiment, the device is set up to keep the source current constant. Constant charge carrier generation and/or constant radiation generation is made possible by means of the constant source current. Constant means, for example, that a standard deviation of the source current is at most 10% or 5% or 1% or 0.5% or 0.1% or 0.05% or 0.01% or 0.005% or 0.001%.

According to at least one embodiment, all or at least some electronic components of the device are integrated in a common microchip or microprocessor. The electronic components are in particular semiconductor components such as diodes, operational amplifiers, transistors, adding elements, control units and memory components. It is likewise possible for voltage sources or current sources or at least for a driver of them to be partially or completely integrated in the microchip or microprocessor.

According to at least one embodiment of the device, the field emission element and/or the extraction electrode is supplied with electrical voltage in a plurality of stages. This means in particular that a plurality of series-connected supply elements such as transistors, for example, so-called PowerMOS transistors, are present. It is possible for a parallel connection of such series circuits to be provided.

In summary, the device described here can thus be operated, in particular, with the following types of control:
anode or cathode current regulation or regulation of the current of the most positive or most negative electrode,
differential current regulation with at least two, a selection of the electrodes or all of the electrodes from each electrode combination, wherein the current can be regulated in each intermediate region,
emission current control.

These types of control can also be combined.

In all embodiments and in all control modes, supplementary electrodes can be present, in each case one or more, also in arbitrary combinations:
variation electrodes are controlled either directly or, for example, via an adder,
additional electrodes, in particular as the last electrode of the device before exiting of the charge carriers of the device or before the charge carriers strike a target region, wherein the additional electrode can be operated in transmission or reflection,
one or more electron-optical or ion-optical elements, for example, for focusing the charge carriers.

In all embodiments and in all control modes and electrode configurations, in particular the following control parameters can be used: current limitation, for example, against ground or on the so-called "high side", light and temperature, extraction voltage, for example, via an OPV. Alternatively or additionally, a variation of the circuitry can be carried out by: temperature compensation, amplification, decoupling the circuit parts, bandwidth and/or controller type or controller parameters.

The device described here can be used in particular for the following application: x-ray source, electron source, ion source, for instance by means of field ionization or ionization between any electrodes by means of electrons.

The invention also relates to a method for operating a device, as described in connection with one or more of the above-mentioned embodiments. Features of the device are therefore also disclosed for the method and vice versa.

In at least one embodiment, the method serves for stabilizing a source current of charge carriers emitted by means of a field emission element, wherein the source current is formed by the charge carriers which have already passed an extraction electrode, by means of which the charge carriers have been extracted from the field emission element, and wherein a variable which is characteristic of the source current is determined in the method and this variable is transferred to a control device as a process variable.

The generated charge carriers, in particular electrons or positively charged ions, can directly leave the device and can be used for various applications. It is likewise possible for the electrons to be specifically used, in order to generate electromagnetic radiation such as x-ray radiation when striking a target surface of the device.

BRIEF DESCRIPTION OF THE DRAWINGS

A device and a method are explained in more detail below with reference to the drawing on the basis of exemplary embodiments. Identical reference signs indicate the same elements in the individual figures. In this case, however, no relationships to scale are illustrated; rather, individual elements can be represented with an exaggerated size in order to afford a better understanding.

In the Figures:

FIGS. 1 to 9 show schematic functional principles on the basis of schematic circuit diagrams for exemplary embodiments of devices described here for methods described here for generating a source current of charge carriers by means of field emission or field ionization;

DETAILED DESCRIPTION OF ILLUSTRATIVE EMBODIMENTS

Figure 1:
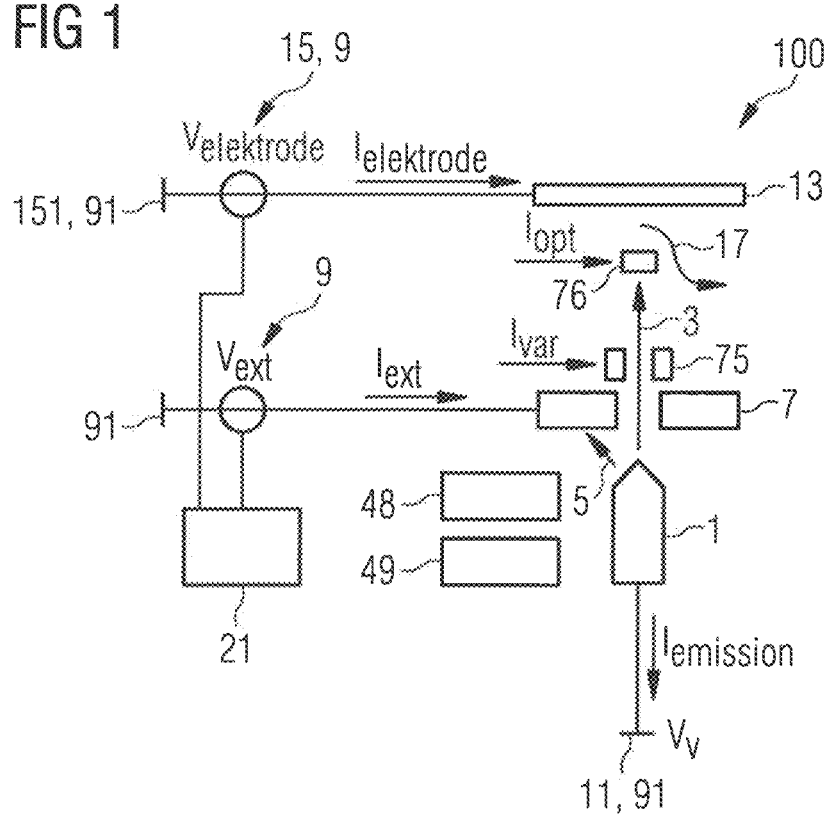

FIG. 1 schematically shows the functional principle of a device 100 proposed herein for generating a source current of charge carriers by means of field emission. In addition, some terms used further above and below are explained in more detail with reference to FIG. 1.

To the extent that it is not indicated otherwise, FIG. 1 and the other exemplary embodiments are formulated for generating electrons as charge carriers. In the case of a different charge carrier polarity, that is to say in the generation of positive ions, the opposite applies with regard to the described voltage polarities.

The device 100 of FIG. 1 has a field emission element 1, consisting of one or more individual emitters such as an emitter array, for example, from a metal or a semiconductor such as silicon or an oxide or a carbon-based material such as diamond-like carbon, carbon nanotubes, graphene or from other materials such as $LaB_6$ or consisting thereof. Charge carriers, in particular electrons, can be extracted from said field emission element 1 by means of field emission during operation of the device 100. The charge carriers extracted from the field emission element 1 are indicated in FIG. 1 by the arrows with the reference signs 3 and 5.

The device 100 further comprises at least one extraction electrode 7. The latter is associated with the field emission element 1. An extraction voltage Vext can be applied to the field emission element 1 by means of the extraction electrode 7. For this purpose, the extraction electrode 7 is electrically conductively connected to an electrical power source 9, preferably a voltage source. The extraction electrode 7 can be electrically conductively connected to an extraction electrode connection of the power source 9.

Apart from the extraction connection, the power source 9 can have a ground connection 91, also referred to as ground connection or GND. The extraction electrode connection is expediently supplied with a higher or lower voltage from the voltage source 9 than the earth connection 91, depending on the charge carrier polarity. Therefore, the connection capability of the power source 9 provided by the extraction electrode connection is sometimes also referred to as high-voltage side or high-side of the power source 9. The ground terminal 91 on the other hand is sometimes also referred to as low-voltage side or low-side.

It is also conceivable and in some cases practicable for the last electrode to be connected to ground connection (ground, GND), and all the emitter regions are at a correspondingly more negative or positive potential. This applies accordingly to all other exemplary embodiments. Only the case of an emitter-side ground connection is shown below, the examples can also be realized with a corresponding ground potential not equal to 0 V.

The field emission element 1 is electrically conductively connected to a supply power source via a supply connection 11, via which the field emission element 1 can be supplied with charge carriers, which can be extracted from the field emission element 1 by the extraction electrode 7. The supply voltage Vv applied via the supply connection is expediently smaller than the extraction voltage Vext in the event of the generation of electrons; in the case of the generation of positive ions, the opposite applies accordingly. For example, the supply voltage is 20 V or less, up to negative voltages. The supply power source can be provided by the power source 9. The supply connection 11 can be realized by the ground connection 91 of the power source 9.

Typical voltage differences between the field emission element 1 and the extraction electrode 7, which are sufficient to extract charge carriers from the field emission element, are in the range greater than or equal to 50 V or of a few 100 V, for example, greater than or equal to 500 V or greater than or equal to 800 V. The required voltages are dependent on the material and on the geometry of the field emission element.

The field emission element 1 has a tip on its side facing the extraction electrode 7, as a result of which the extraction of charge carriers is obtained. For the passage of extracted charge carriers through the extraction electrode 7, the extraction electrode 7 is preferably perforated. The charge carriers extracted from the field emission element 1 contribute in their entirety to an emission current Iemission flowing away from the field emission element 1 in the direction of the supply connection 11. The emission current Iemission is caused by the totality of all charge carriers extracted from the field emission element 1. This means that the emission current is equal to the sum of the extraction current and the source current.

The charge carriers extracted from the field emission element 1 can be divided into two fractions, namely the fractions 3 and 5. The first charge carrier fraction 3 passes through the extraction electrode 7. For this purpose, the extraction electrode 7 is cut-out, preferably in a region in which the field emission takes place predominantly, expediently in the region which lies above the at least one tip of the field emission element 1. The second charge carrier fraction 5 of the extracted charge carriers reaches the extraction electrode 7, in particular immediately after the extraction from the field emission element 1, and generates an extraction current Iext in the extraction electrode 7. If the charge carriers are electrons, the technical current flow direction is from the power source 9 towards the extraction electrode 7, as illustrated in FIG. 1.

The charge carrier fraction 3 which has passed through the extraction electrode 7 contributes to the or forms the source current of charge carriers generated by the field emission element 1 by means of field emission. Consequently, the fraction 3 is the totality of the extracted charge carriers reduced by the charge carrier fraction 5 absorbed in the extraction electrode 7.

In addition, the device 100 of FIG. 1 comprises a control device 21 which is illustrated only in a highly simplified manner. The control device preferably has a GND connection (not shown in FIG. 1) and/or is connected to another voltage supply. Furthermore, the control device 21 preferably influences the electrical potential of the extraction electrode 7, of the field emission element 1 and/or of the additional electrode 13, wherein the electrical connection required for this in FIG. 1 is not drawn or is only shown very schematically. The control device is explained in more detail in conjunction with the following exemplary embodiments.

The device 100 comprising the extraction electrode 7 and the field emission element 1 can serve as a charge carrier source, for example, for applications requiring free charge carriers. Such applications are, for example: for an x-ray tube, for electron beam lithography or e-beam lithography, for gas ion mobility spectroscopy, for a smoke alarm, for mass spectrometry or similar applications. The device 100 can in particular be designed as a device for said purposes and thus, apart from the aforementioned components, can include further components, such as are required, for example, for an apparatus for electron beam lithography or for an x-ray tube.

As illustrated in FIG. 1, the device 100 has, for example, an additional electrode 13, in particular a most positive or most negative electrode. The source current of charge carriers, formed by the charge carrier fraction 3 which has passed through the extraction electrode 7, can strike the additional electrode 13.

The additional electrode 13 can be electrically conductively connected to an electrode connection of a power source 15. The electrode voltage Velektrode can be applied to the electrode via the power source 15, so that this voltage is applied to the additional electrode 13. The electrode voltage Velektrode is preferably the most positive or the most negative voltage applied. The power source 15 can be realized by the power source 9 or by another power source, wherein the electrode connection is expediently different from the extraction electrode connection. The horizontal line in FIG. 1 in turn symbolizes the ground connection 151, 91 of the respective power source.

The charge carriers striking the additional electrode 13 lead to an electrode current Ielektrode flowing in the additional electrode 13. If the charge carriers are electrons, the technical current flow direction is directed from the power source 15 to the additional electrode 13. Further above and below, the electrode current and the electrode voltage can also be referred to as anode current and anode voltage.

The charge carriers striking the additional electrode 13 can generate electromagnetic radiation, in particular x-ray radiation. The radiation can be radiated from the additional electrode 13. This is indicated in FIG. 1 by the arrow with the reference sign 17, which symbolizes the generated electromagnetic radiation. In the case of an electron or ion source, the emission of the electrons preferably takes place either through an opening of the additional electrode 13 or through transmission of a closed additional electrode 13.

Alternatively or in addition, a variation electrode 75 can be provided, as also in all other exemplary embodiments. The variation electrode is preferably arranged between the additional electrode 13 and the extraction electrode 7. The charge carrier flow thus initially passes through the variation electrode 75 and can just strike the additional electrode 13 later. Alternatively, the additional electrode 13 can also be dispensed with. Furthermore, the device 100 can have an optical element 76, in particular an electron-optical element, of the charge carrier optical system. Such optical elements 76 comprise, for example, apertured diaphragms, Wehnelt cylinders, capacitor plates and/or magnets such as ring magnets.

Said optical element 76 can be arranged along the charge carrier flow after the extraction electrode 7 and/or the variation electrode 75. The source current of charge carriers can, for example, be suitably focused by the optical element 76 of the charge carrier optics, so that it impinges on the additional electrode 13 in a defined region.

In contrast to the illustration in FIG. 1, the variation electrode 75 and the optical element 76 can also be present in the reverse order. If the device 100 is used as an electron or ion source, the charge carriers are transmitted through the additional electrode 13; thus, in particular, the optical element 76 can also be arranged after the additional electrode 13 and/or the variation electrode 75 can be used as an electron or ion transmission window. The same applies to all other exemplary embodiments.

In FIG. 1, a control and influencing of the behavior, in particular of the field emission element 1 and/or of the control device 21 by means of a temperature unit 48 and alternatively or additionally by means of an illumination unit 49, is optionally possible. The temperature unit 48 can be used to set a temperature of the field emission element 1 and/or the control device 21. The field emission element 1 and/or the control device 21 can preferably be illuminated by means of the illumination unit 49, for example, with near ultraviolet radiation, visible light or infrared radiation. Such a temperature unit 48 and/or illumination unit 49, which is shown only in a highly schematic manner in FIG. 1, can also be present in all other exemplary embodiments.

In the following, measures are described by means of which the source current of charge carriers can be stabilized, wherein in the exemplary embodiments one or more of these measures are present in each case. This is to be understood in particular to mean that fluctuations in the electrode current, in the generated electromagnetic radiation and/or the width of the distribution of the kinetic energy of the electrons are reduced.

With one or even a combination of these measures, a particularly stable charge carrier source or radiation source can be provided. The proposed charge carrier source is particularly suitable for use in a device which is designed as a radiation source, since the generated radiation also has only particularly small intensity fluctuations due to the stable source current. A charge carrier optical system, for example, for electrostatically focusing the emitted charge carriers, can be formed in a simplified manner on account of the advantageously narrow spectrum of the distribution of the kinetic energy of the charge carriers.

In order to keep the source current of charge carriers as uniform and constant as possible or to modulate it in a specific manner, various control concepts are proposed in the present case. A group of concepts has the basic idea, for regulating the source current, to set a variable which is characteristic for the source current itself. In particular, this is a controlled variable in which it is taken into account that a part of the extracted charge carriers does not contribute to the source current, but leads to currents in one or more of the electrodes, as explained above. A further group of concepts relates to the fact that the variation electrode 75 is provided in addition to or as an alternative to the additional electrode 13, by means of the variation electrode 75 the kinetic energy of the extracted charge carriers of the source current can be changed.

The source current can be stabilized by controlling the controlled variable Q characteristic of the source current. In this case, the variation electrode 75 can be used in addition to the control via the controlled variable Q, or else in other control systems, in particular those which have the consequence that there are fluctuations in the kinetic energy of the extracted charge carriers on account of the control, so that the fluctuations can be reduced via the variation electrode 75. The variation electrode 75 can therefore lead to a simplified optical element 76 of the charge carrier optical system arranged downstream of the variation electrode 75 because of the narrower distribution of the kinetic energy of the charge carriers after influencing the kinetic energy by the variation electrode 75.

For the controlled variable Q, in particular it applies: Q=Iemission−Iext−Ielektrode−Ivar−Iopt, wherein Ivar is the current through the optional variation electrode 75 and Iopt is the current through the optional optical element 76. Q is thus in particular the emission current minus all electrode currents up to and including the most positive electrode. In order to regulate the current in a selected intermediate range, only a part of the existing electrodes can also be used to form the difference.

The source current can be measured by measurement, for example, of the electrode current or by measuring the electromagnetic radiation generated by the charge carriers on the additional electrode 13.

Figure 2:
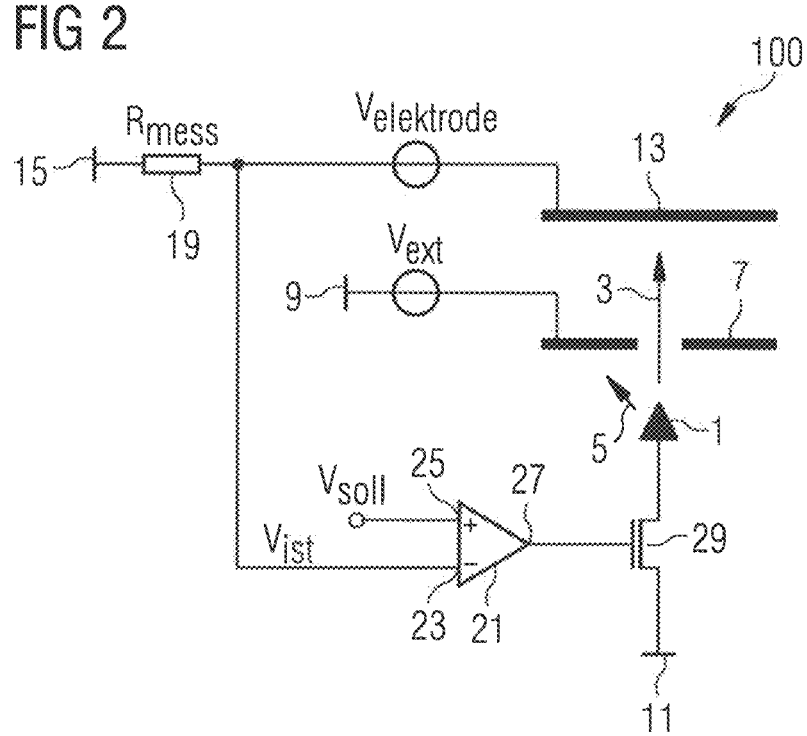

An exemplary embodiment of such a control by means of a control variable, which does not depend on the extraction current, is schematically represented in FIG. 2.

The basic elements of the illustrated device 100 are already illustrated and explained in FIG. 1. To this extent, reference is made to FIG. 1. In the concept proposed in FIG. 2, a variable which is characteristic of the electrode current Ielektrode is used as a control variable. The electrode current is caused by the charge carriers of the source current 3 in the additional electrode 13, for which reason the electrode current is characteristic of the source current.

In order to detect the electrode current, the device 100 comprises an electrode current detection element 19, for example, realized by means of a measuring resistor Rmess. The voltage drop Vist on the electrode current sensing element 19 is characteristic of the electrode current Ielektrode.

Furthermore, the device 100 has the control device 21. In the present example, the control device 21 is formed by an operational amplifier, OPV for short. Alternatively or in addition to an OPV, it is possible for the control device 21 or for optionally present, other OPVs to use HF amplifiers or ASICs. HF stands for high frequency and ASIC for application-specific integrated circuit.

The part of the device 100 that generates the extracted charge carriers can be influenced via the control device 21. The control device 21 has an input 23 to which the controlled variable Q, that is to say Vist, is supplied. The input 23 is thus coupled to the branch of the additional electrode 13. The control device is furthermore supplied with a setpoint value Vsoll or is stored therein. For the supply of the desired value, the control device 21 can have a further input 25. The desired value can be constant in time or, if a modulation of the source current is desired, change in time in a predetermined manner. The control device also has an output 27.

The device 100 also has a control element 29, in particular a current control element. The charge carrier flow from the supply power source 9 to the field emission element 1 can be controlled via the control element 29. The output 27 of the control device 21 is expediently electrically conductively connected to the control element 29. During operation of the device, the controlled variable Q is compared with the setpoint value and, if there is a difference, the control element is controlled so that the emission current changes in a manner so that the source current 3 behaves in such a way that the predetermined target value is reached. In particular, if the control device 21 is designed as an operational amplifier, the control variable is compared with the desired value, and if there is a difference, the difference with the predetermined and set gain and/or with the set integration constant and/or with a differentiation constant (PID controller) is issued. Any other type of control is also conceivable, such as, for example, a fuzzy logic.

The control element 29 can be embodied, for example, as a transistor, in particular as a field-effect transistor, such as, for example, as a MOSFET. The output 27 of the operational amplifier 21 is preferably connected to the gate of the transistor of the control element 29, so that the charge is integrated onto the gate of the transistor, until the source current is so large that the actual value assumes the predetermined target value.

The extraction voltage Vext is particularly preferably selected such that the control device 21 has sufficient reserve to regulate the emission current. This means, for example, that the operating point of the field emission element 1 lies significantly above the desired current. The regulation of the current at the operating point is thus reduced and a change in the field emission properties can be counteracted.

In the exemplary embodiment according to FIG. 2, the additional electrode 13 is designed to be impermeable to the source current 3. Deviating from the representation in FIG. 2, it is likewise possible that the additional electrode is permeable or partially permeable to the source current. If the additional electrode is designed to be permeable, it can be penetrated either by a part of the source current, for example, if it is designed to be very thin, or corresponding to the electrode 7, which is designed, for example, as a ring electrode or as a grid electrode, comprising one or more recesses, through which at least a part of the charge carriers of the source current passes. A further part of said charge carriers can be absorbed in the additional electrode 13 and contribute to the electrode current, which is then characteristic for the source current. The invention also relates to a targeted, intended ionization of, for example, gas in the intermediate space between the additional electrode 13 and the field emission element 1.

The control variant described above, in which the controlled variable Q is obtained directly from the electrode current at the additional electrode 13, is also referred to as electrode current regulation or anode current regulation or most positive electrode current regulation.

Figure 3:
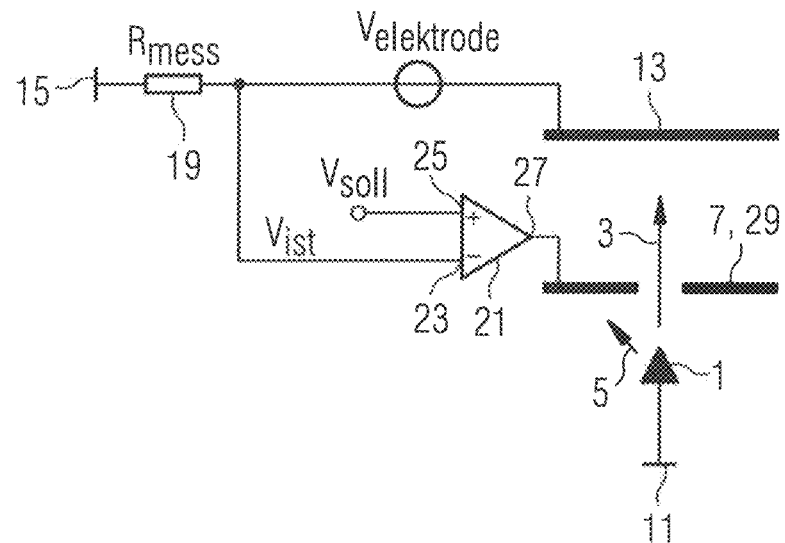

A variant of the electrode current regulation is illustrated in FIG. 3. In contrast to FIG. 2, the charge carrier inflow to the field emission element 1 is not regulated in FIG. 3, but the extraction electrode 7 is controlled by means of the control device 21, so that the extraction electrode 7 serves as a control element 29. Since the emission current caused by the totality of the extracted charge carriers is controlled via the extraction electrode 7, the source current is also controlled indirectly, since the latter is generated by a part of the extracted charge carriers, namely the fraction 3 according to FIG. 2. In this case, a comparison between an actual value Vist and a setpoint value Vsoll is preferably carried out in the control device 21, as explained in conjunction with FIG. 2.

However, the electrode current at the additional electrode 13 cannot always be detected directly. This applies, for example, when the device 100 is operated as a pure charge carrier source or is a device for ionizing gas. A control concept is therefore described below, in which the proportion of the source current 3 on the extracted charge carriers is calculated from the available variables. Such a concept is illustrated with reference to FIG. 4 and is also referred to as a differential current control.

This figure also corresponds in the essential components to FIG. 2. The block with the additional electrode 13 is represented by dashed lines, since, as explained above, the additional electrode 13 is not absolutely necessary for this control concept, but can be provided.

Since the electrode current does not have to be detected, no electrode current sensing element is provided. In the concept according to FIG. 4, however, in particular two other currents are detected, namely the extraction current Iext and the emission current Iemission. For this purpose, the device 100 has an extraction current detection element 31, for example, a resistor. The extraction current can be detected via the voltage drop across the resistor. Furthermore, the device 100 has an emission current detection element 33, for example, a resistor. The emission current can be detected by the voltage drop at the emission current detection element 33.

A control variable determination element 35 is connected upstream of the control device and, in particular, is connected to the input 23. The control variable determination element 35 can comprise one or more inputs 37, 39 and can be designed as an OPV, for example. Furthermore, the control variable determination element 35 has an output 41. The latter is preferably conductively connected, in particular directly connected, to the input 23 of the control device 21. The control variable determination element 35 can, for example, be a subtraction element in which the difference of a variable characteristic of the emission current, for example, the voltage drop at the emission current detection element 33, and a variable which is characteristic of the extraction current, for example, the voltage drop at the extraction current detection element 31, is provided. In addition, some or more of the currents can be used in further electrodes in order to determine the controlled variable, for example, by Q=Iemission−Iext−Ielektrode−Ivar−Iopt, see the statements relating to FIG. 1.

One of the inputs, in the exemplary embodiment the input 39, is conductively connected to the extraction current detection element 31, so that the value characteristic of the extraction current is supplied to this input. The same applies to the input 37 and the emission current detection element 33. The control variable Q, which is supplied to the input 23 of the control device 21, is accordingly a function of the difference of values which characterize the extraction current and the emission current. For example, the value which is characteristic of the extraction current and which is usually smaller is subtracted from the value characteristic of the emission current.

By means of the difference between these values, the electrode current, which can possibly not be determined in a simple manner, can be estimated, as illustrated, as the source current 3 of charge carriers which can cause the electrode current, in the ideal case, corresponds approximately to the emission current apart from the charge carrier component 5, which is responsible for the extraction current.

If further electrodes are present, a differential control can also be carried out on the basis of other control variables, as stated above.

Figure 5:
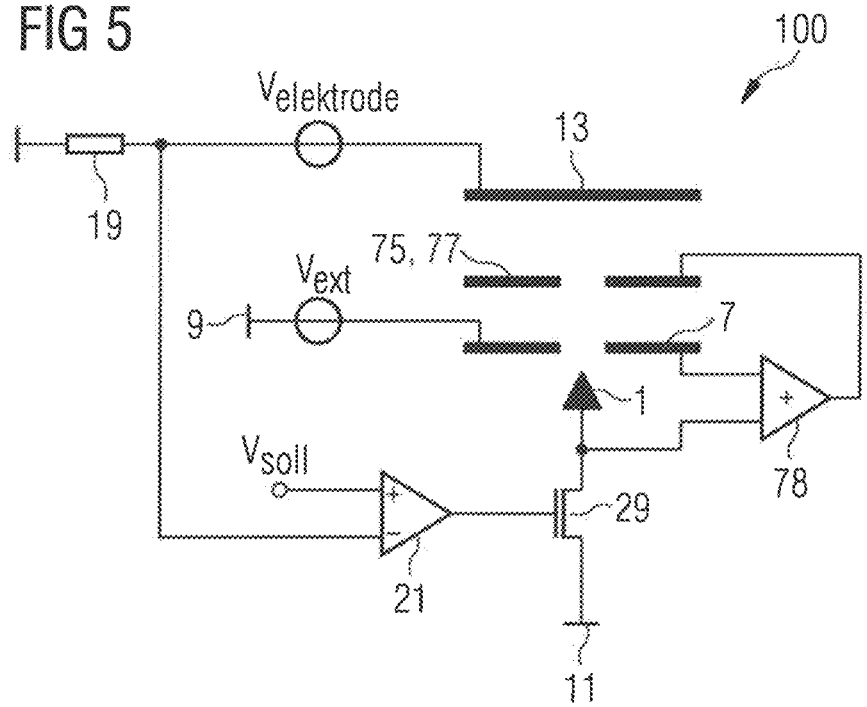

FIG. 5 illustrates a further exemplary embodiment of the device 100. The voltage drop across the control element 29, in particular by means of the control with the MOSFET, results in a spectrum of the kinetic energy of the emitted charge carriers which is widened by the variation of the drop. As a result, the spectrum of the pure field emission which is narrow in comparison with the thermal emission is artificially broadened. This can make the electrostatic focusing of the emitted charge carriers, in particular electrons, considerably more difficult.

This voltage drop can be compensated for by a further electrode 7 with a so-called tetrode configuration and by an adding element 78. The kinetic energy of the charge carriers then varies at the additional electrode 13, but an optional electron optics (not shown) could be located exactly between the additional electrode 13 and the further electrode 7 or, for example, exactly between these electrodes ionization takes place, this means that a constant current and a constant kinetic energy are required in this region. The further electrode 7 can be the variation electrode 75, or the further electrode 77 is different from the variation electrode 75. The adding element 78 is preferably formed by an adder, both inputs of which are connected in particular to the field emission element 1 and the extraction electrode 7 and the output of which is connected to the further electrode 7 and/or the variation electrode 75. In contrast to the illustration in FIG. 5, the additional electrode 13 can be identical to the further electrode 7.

In FIG. 5, the tetrode configuration is illustrated together with the adding element 78 for the electrode current regulation of FIGS. 2 and 3. In the same way, such an arrangement can be used in the differential current control of FIG. 4. In a variation of the exemplary embodiments of FIGS. 3 and 4, an OPV with a differential control can also be used directly. The different aspects in the exemplary embodiments of FIGS. 3 to 5 can also advantageously be combined with one another.

Figure 6:
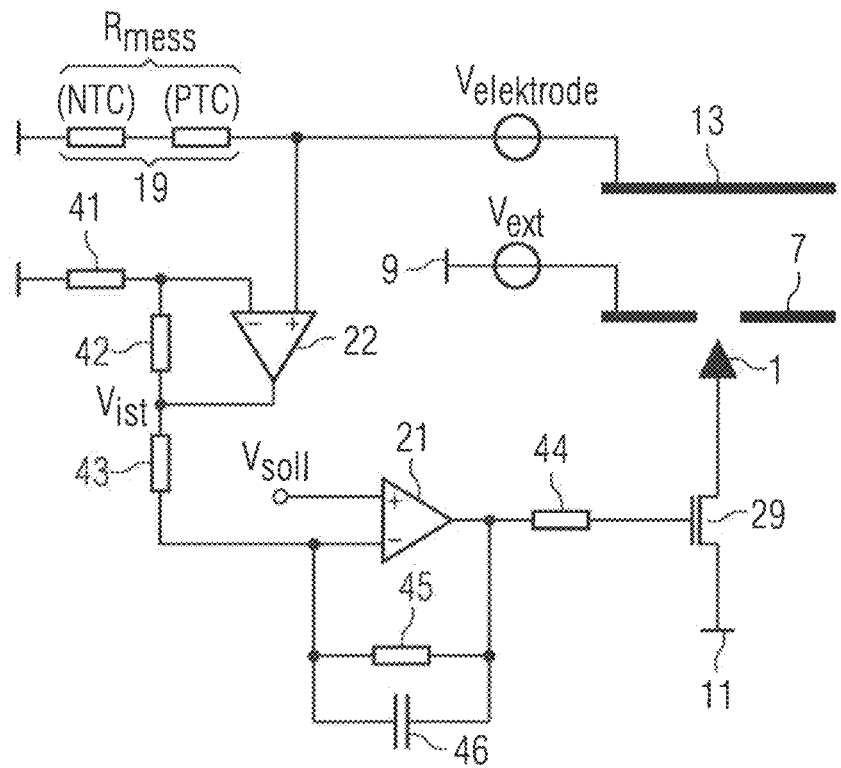

In the exemplary embodiment of FIG. 6, optional additional aspects are shown, which can also be present individually or in combination in all other exemplary embodiments.

In a first aspect, temperature compensation is carried out. For this purpose, it could be expedient to compensate for the temperature dependence, in particular of the current measurements, by means of a suitable circuit, or to be minimized by means of suitable components. For this purpose, the electrode current detection element 19 can comprise or consist of, for example, a series circuit comprising two resistors having an opposite temperature coefficient.

In a second aspect, an amplification can be reduced. This means that the OPV of the control device 21 is determined by a feedback with a resistor 45 and an additional series resistor 43 with reduced amplification.

In a third aspect, the transistor and the controller can be decoupled. For this purpose, a resistor 44 is located between the gate of the MOSFET of the control element 29 and the output of the regulating device 21. Thus, a more stable operation can be achieved, in particular a lower sensitivity to oscillations.

In a fourth aspect, the controller can be adapted, for example, the integration component by means of an additional capacitor 46 in the feedback of the control device 21, in particular in addition to a gate capacitance of the control element 29. Alternatively, other controller concepts, such as a fuzzy logic, are also conceivable.

In a fifth aspect, the bandwidth can be adapted by all additional components shown in FIG. 6 or by further components.

Figure 4:
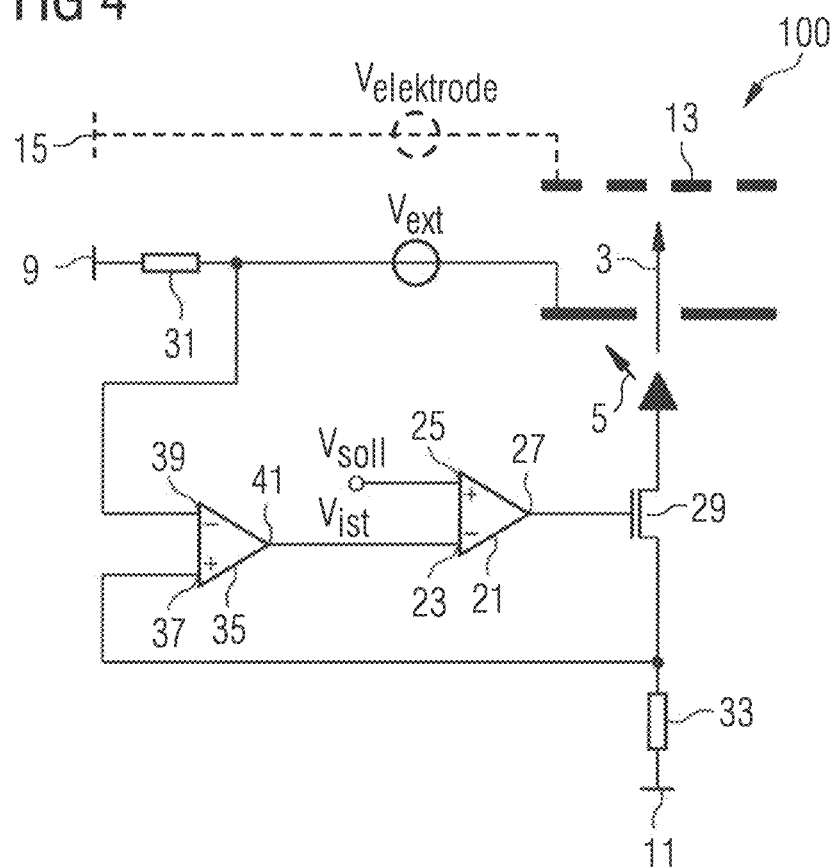

The additional aspects in FIG. 6 for an electrode current control can also be used in the same way in the differential current control, see FIG. 4.

In all exemplary embodiments for regulating the electrode current, a further OPV circuit (such as, for example, the OPV 22 having the resistors 41 and 42 in FIG. 6) with the lowest possible input current in order to decouple the current measurements and/or to set the voltages to favorable values can be used. A decoupling can also be realized with resistors between the circuit parts.

Figure 7:
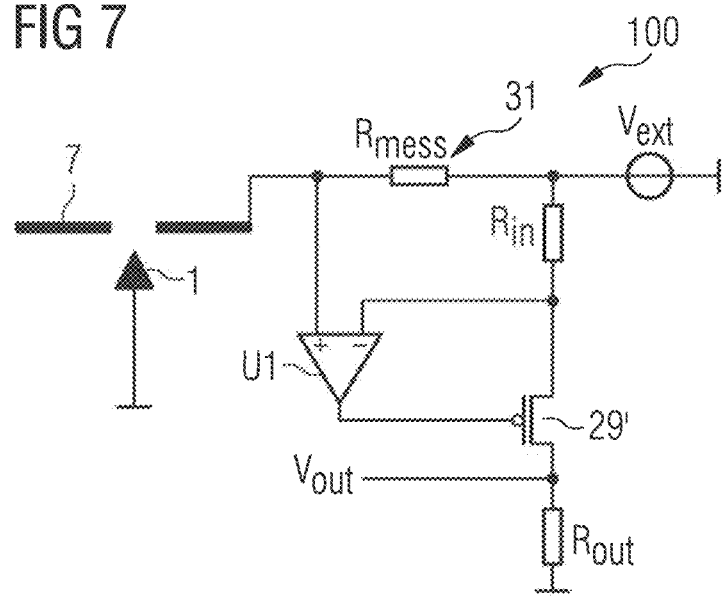
Figure 8:
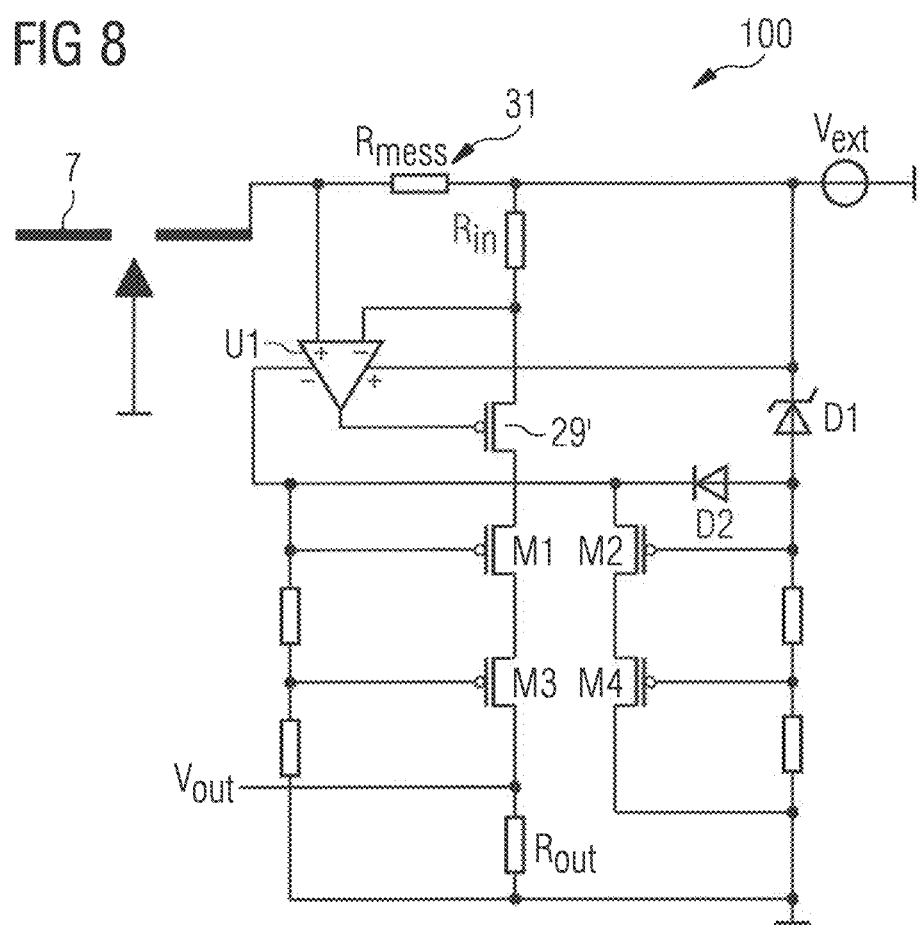

In the exemplary embodiments of FIGS. 7 to 9, a so-called high-side measurement is carried out, that is to say measurement at the "high" side, shown in the example of the detection of the extractor current. Likewise, this type of current measurement is also possible for all other currents, such as, for example, for the current at the electrode 13. In this case, another, in particular second current measurement is carried out for the differential current regulation on the "high" side of the power supply unit. This is achieved by means of a series of PowerMOS transistors 29', M. In this case, a single stage allows a voltage to be applied as a function of the permissible drain-source voltage of the respective transistor. Thus, for example, approximately 400 V per stage can be achieved using the currently available transistors. For higher voltages, a plurality of stages M1-M4 are correspondingly present. In the exemplary embodiments of FIGS. 7 to 9, one current sensing element 31 is present on the high side.

The high-side measurement is first explained in more detail with reference to FIG. 7, without the actual Power-MOS stages. The extraction current leads to a voltage drop V_sense at a measuring resistor Rmess, 31. The OPV U1 controls, in a manner similar to the presented control concept from the previous figures, through the transistor 29' the current through Rin in such a way that there is no voltage drop across the OPV inputs. This means that, in the regulated state, a voltage drop at Rin is obtained equal to the voltage drop V_sense on the measurement element Rmess, 31. The resulting current via the transistor 29' is thus: I=V_sense/R_in.

In order to keep the measurement error as small as possible, an OPV with the largest possible impedance is preferably selected, so that the current into the input of the OPV U1 is as small as possible. The current can be transformed into a voltage with the aid of Rout. The resulting voltage is thus: V_out=V_sense*R_out/R_in.

The field of use of the circuit shown in FIG. 7 is limited by the withstand voltage of the amplifier U1 and of the transistor 29. FIG. 8 shows a concept by means of which the maximum permissible voltage can be increased.

Further transistors M, in particular MOSFETs, can be used to decouple the high voltage from the low-voltage side, between the transistor 29' and the resistor Rout and the negative supply input of the OPVs U1 and ground. The MOSFETs used are preferably high-voltage-resistant p-channel MOSFETs, for example, of the type FQD3P50. In order to achieve higher voltages than the maximum drain-source voltage of a MOSFET, this voltage decoupling can be set up several times in succession, see the transistors M1-M4. In the case of FIG. 8, a two-stage structure is shown. In this case, the maximum insulation voltage for an n-stage structure, where n=2, is V_max=n*V_DSS. The diode D1 can provide, by the selection of a suitable breakdown voltage, the necessary voltage difference to supply the OPVs U1.

The voltage Vout of the high-side measurement can now be used for one of the presented types of control. FIG. 9 shows a one-stage version of the high-side measurement in conjunction with the differential current regulation from FIG. 4. However, the high-side measurement is also possible with the other control modes, such as, for example, the emission current control from FIG. 2 and FIG. 3.

For this purpose, it is expedient to adapt the voltage Vout to the requirements of the further circuit by means of a non-inverting amplifier 36 and to decouple it therefrom. After this optional intermediate stage, for example, exactly as in FIG. 4, the difference between the emission current and the extractor current measured on the high side is regulated.

Figure 10A:
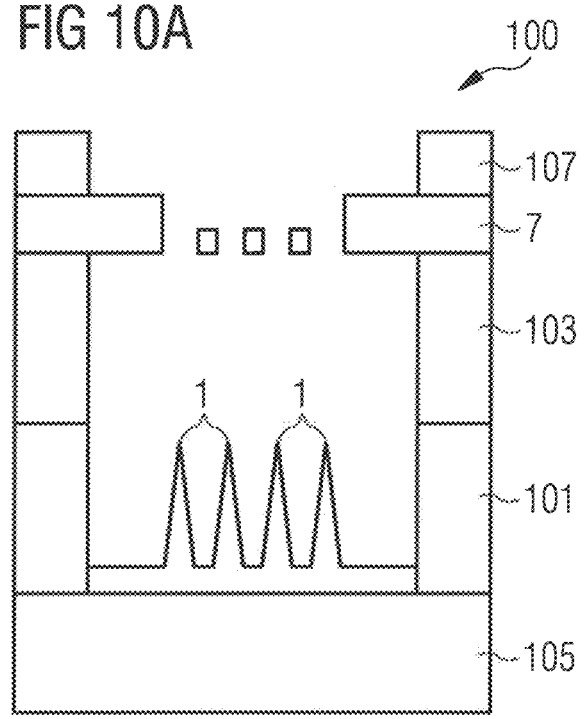
FIGS. 10A to 10C and FIGS. 11A to 11D show schematic representations of structures of exemplary embodiments of the device.
Figure 10B:
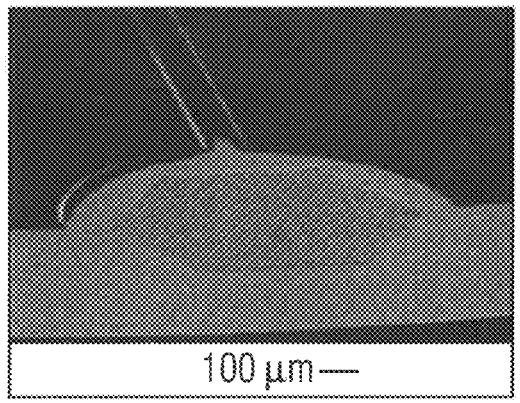
Figure 10C:
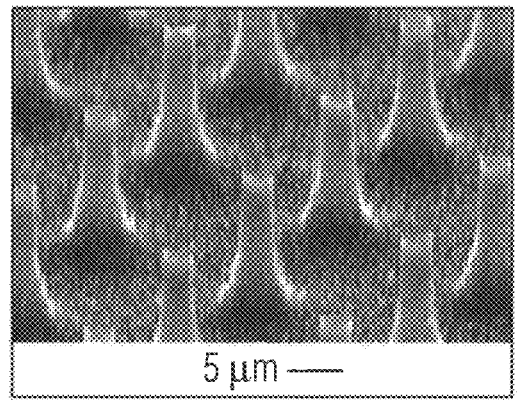

FIG. 10 illustrates a structure of the device 100 in the region of the field emission element 1. In this case, the field emission element 1 is formed by an emitter array 101 having a multiplicity of tips, see the schematic cross-sectional drawing in FIG. 10A and the scanning electron microscope pictures in FIGS. 10B and 10C. The tips are, for example, etched from silicon and optionally coated.

A metallic contacting 105 of the emitter structure is located below the emitter array 1ot. The emitter array 100 is formed by a layer 103 made of an insulator material, for example, mica, in particular with a thickness of between 20 µm and 150 µm inclusive, and is electrically isolated from the extraction electrode 7 in the form of an extraction grid. A metallic contacting 107 of the extraction grid is located on the extraction electrode 7. Typical values for the electrical voltage between the extraction electrode 7 and the tips are in particular between 200 V and 1000 V in the case of such a design.

Figure 11A:
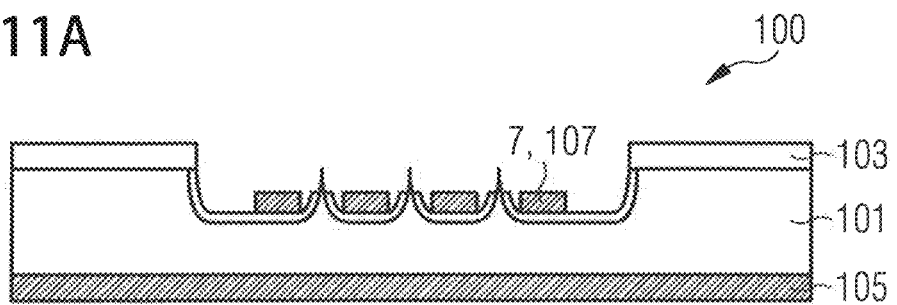
Figure 11B:
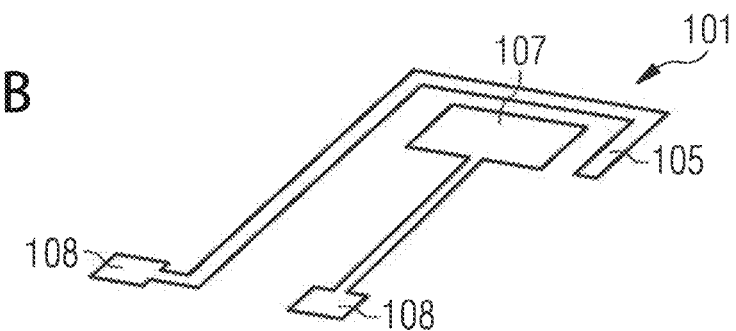
Figure 11C:
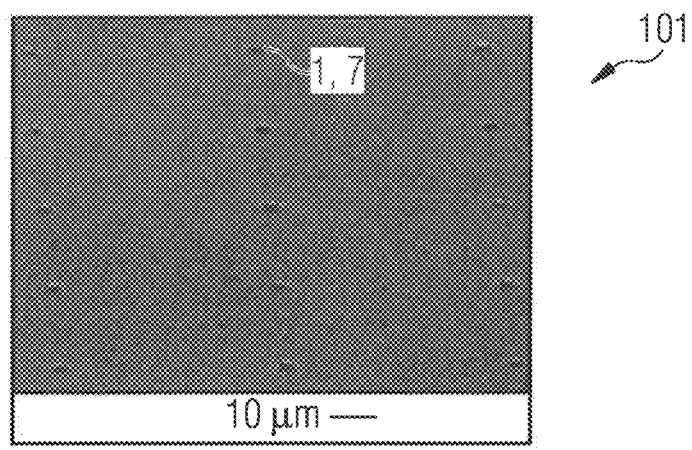
Figure 11D:
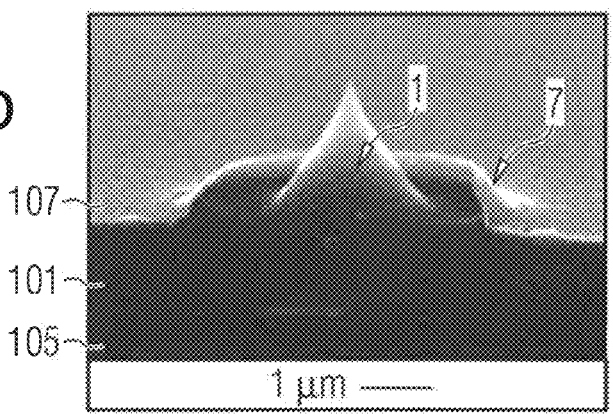

In the exemplary embodiment of FIG. 11, the device 100 comprises a field emission element 1 having an integrated extraction electrode 7, see the schematic illustration in FIG. 11A and the scanning electron microscope recordings in FIGS. 11B to 11D.

In this case, an array of tips for the field emission element is present. Said array 1ot is, for example, etched from a semiconductor material such as silicon. The insulating layer 103 is applied to the emitter array 1ot, which is made of silicon dioxide, for example, and in particular has a thickness of approximately 1 µm. The metallization 107 for the extraction electrode 7 is formed as a grid and is made of gold, for example, in particular with a thickness of approximately 200 nm. The tips of the array 1ot can project beyond the extraction electrode 7. Overall, the extraction electrode 7 and the tips can be located in a recess of a support, which is formed by the material for the tips. The emitter array 101 and thus the field emission element 1 are electrically contacted via the planar metallization 105. Typical voltage values for this structure lie in the range of between 20 V and 200 V inclusive.

In FIG. 11B, the electrical connections 108 for the metallizations 105, 107 are shown, which are designed, for example, as bond pads. The emitter array 101 with the grid-shaped extraction electrode 7 can be seen in FIG. 11C. An individual tip of the field emission element 1 with the associated extraction electrode 7 is shown in FIG. 11D.

The further parts or all electronic components of the device, such as the transistors, operational amplifiers, diodes, adders and/or resistors can be monolithically integrated in both cases, an integrated circuit (see FIG. 11) or a mechanically applied extractor electrode (see FIG. 10), in which the carrier is made of a semiconducting material like Si, Ge or SiGe, from which the tips are produced. Furthermore, it is also possible that a plurality of the other, optionally present electrodes 13, 75, 76, 77 can be monolithically integrated by a thin-film structure, similar to the application of the gate metal in FIG. 11. It is also conceivable to realize the proposed circuit concepts partially or completely for each individual emitter or groups of individual emitters.

Figure 12:
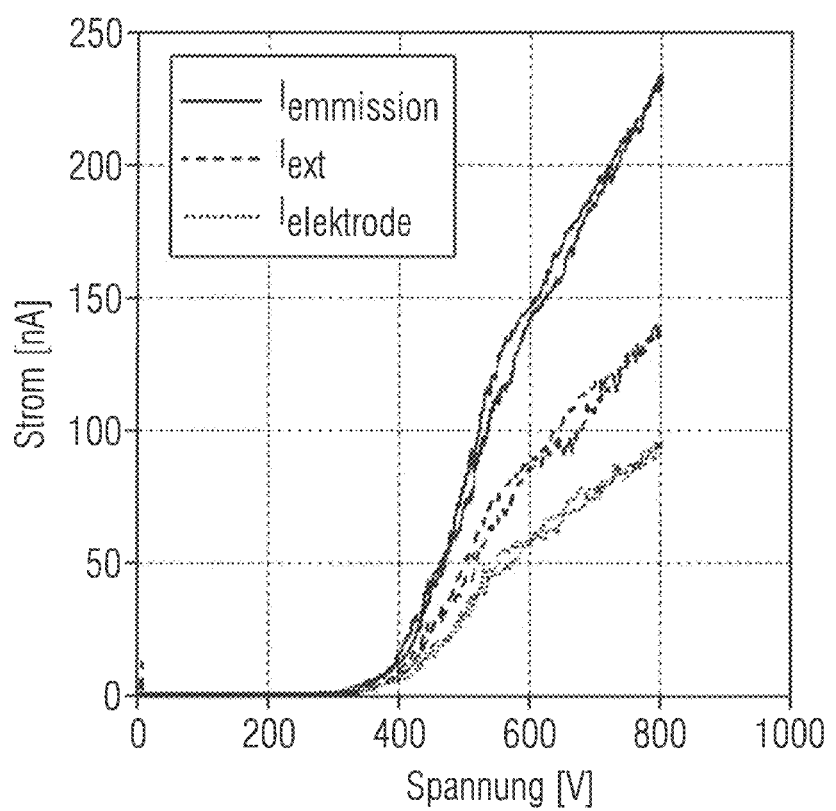
FIGS. 12 to 14 show measurement curves for the electrode current, the emission current and the extraction current and the x-ray flow in an exemplary embodiment of the device.

In FIG. 12, measurement curves for the electrode current Ielektrode, the emission current Iemission and the extraction current Iext of an exemplary device 100 are shown. The electrode current Ielektrode is approximately 40% of the emission current Iemission, however, can also be at least 0.05% or 0.2% and/or at most 100% or 2% or 1% of the extraction current Iext.

Figure 13:
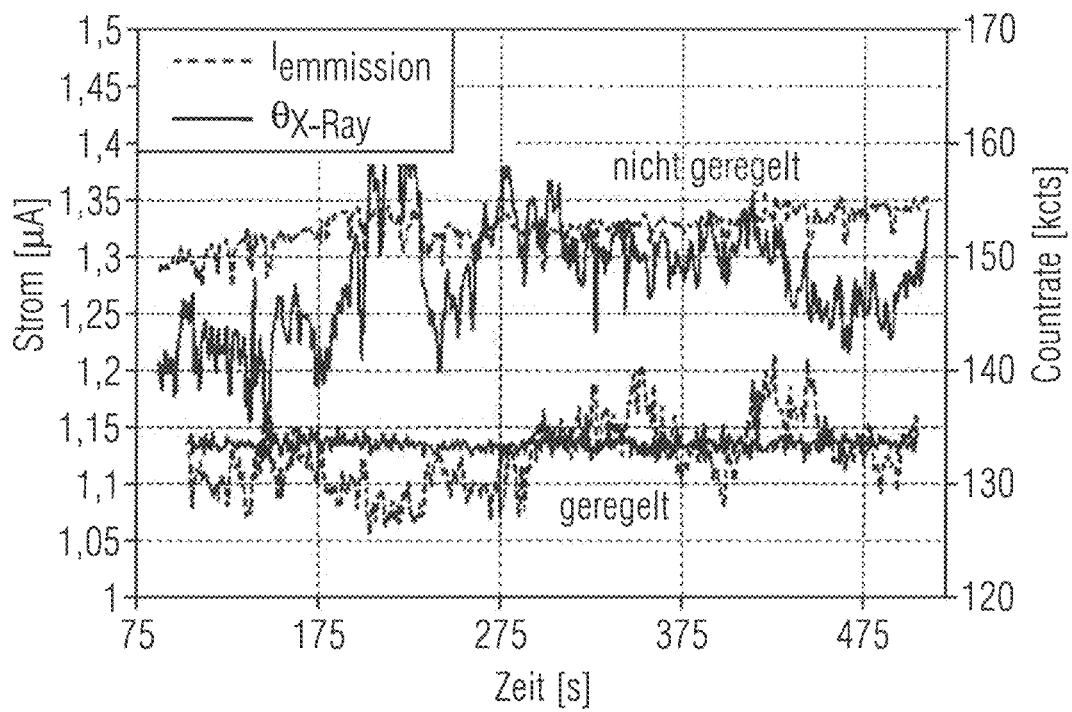
Figure 14:
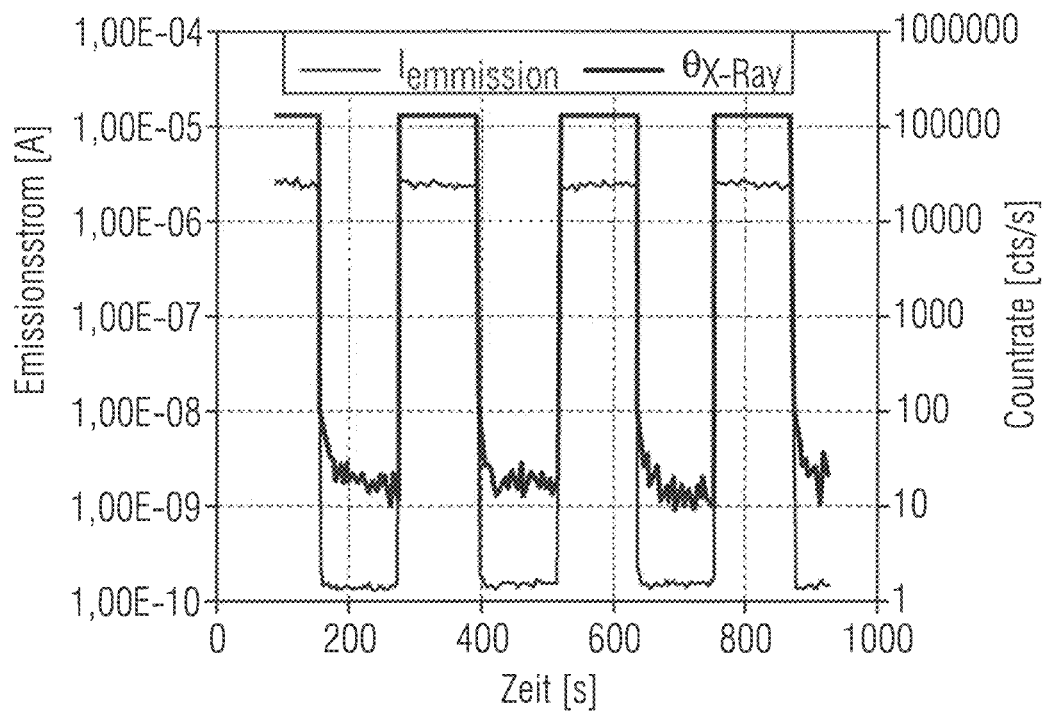

In FIGS. 13 and 14, depending on the time, the emission current Iemission and the flow of x-ray photons θx-ray are illustrated, wherein the device 100 is used as a radiation source for x-ray radiation. The emission current Iemission is plotted in A or µA, the flow θx-ray is plotted in counting units or thousand counting units per second (count rate). The field emission element 1 is in this case an array of p-doped silicon columns consisting of 100 individual emitters and having a multiplicity of tips realized by an etching process and is operated in saturation.

In FIG. 13, it can be seen that unregulated the x-ray flow stability is lower than the emission current stability. In controlled operation, the x-ray flow stability increases, but the emission current stability decreases. The present invention is based in particular on this result.

FIG. 14 shows that the control can also be used for switching on and switching off the emission current. For this purpose, the desired value V_ist has been modulated in time (on/off). In the switched-on state, the target value is regulated directly. The control time for switching on is below 10 ms. The switch-off time is not caused by a physical effect, but by the circuit. By optimizing the circuit, both the switch-on time and the switch-off time can be reduced. In the optimized case, a switch-off time equal to the switch-on time can be achieved.

The invention described here is not restricted by the description on the basis of the exemplary embodiments. Rather, the invention encompasses any new feature and also any combination of features, which includes in particular any combination of features in the patent claims, even if this feature or this combination itself is not explicitly specified in the patent claims or exemplary embodiments.

What is claimed is:

1. A device for generating a source current of charge carriers by a field emission or a field ionization, the device comprising:
    at least one field emission element from which the charge carriers emerge during operation of the device, which lead to an emission current in the field emission element;
    at least one extraction electrode for applying an extraction voltage in order to extract the charge carriers from the field emission element, wherein a first part of the extracted charge carriers contributes to the source current, and a second part of the extracted charge carriers impinges on the extraction electrode and leads to an extraction current in the extraction electrode;
    an additional electrode on which the source current of charge carriers impinges at least in part and which contributes to an electrode current in the additional electrode; and
    a control device, wherein the control device is set up, during operation of the device, to reduce fluctuations of a controlled variable Q which is a characteristic of the source current, wherein the controlled variable Q is a function of the electrode current in the additional electrode, and wherein the controlled variable Q is additionally a function of a difference between the emission current and the extraction current.

2. The device according to claim 1, further comprising:
    at least one control element which is set up to change the emission current, wherein the control device is set up to control the control element; and
    at least one variation electrode which is set up to change a kinetic energy of the extracted charge carriers of the source current by a variation voltage applied to the variation electrode.

3. The device according to claim 2,
    wherein the control device comprises at least one input to which an up-to-date value of the controlled variable is supplied and an output which is connected to the control element,
    wherein the device is designed such that the control element is controlled via the output, so that the control variable assumes a predetermined target value.

4. The device according to claim 1, wherein the device is designed in such a way that, during operation of the device, a temporal distribution of the variable Q which is characteristic of the source current has a standard deviation $S_Q$ which is less than or equal to 0.5%.

5. The device according to claim 1, further comprising:
    at least one electron-optical element;
    at least one variation electrode; and
    at least one additional electrode,
    wherein Q is equal to the emission current, reduced by the currents through the variation electrode, the electron-optical element and the additional electrode or reduced by a part of these currents.

6. The device according to claim 1, further comprising a plurality of power transistors, which are electrically connected in series at least in part, wherein the power transistors are mounted between the field emission element and the extraction electrode or the additional electrode in order to perform current measurement and in order to isolate voltages above a withstand voltage.

7. The device according to claim 1,
    wherein the additional electrode is a most positive or a most negative electrode of the device,
    wherein the source current of charge carriers is formed by a charge carrier component which has passed through the extraction electrode, which impinges on the additional electrode, and
    wherein the additional electrode is electrically conductively connected to an electrode connection of a power source of the device.

8. The device according to claim 1,
    wherein the device is designed as a radiation source,
    wherein electromagnetic radiation to be emitted by the radiation source is generated by the source current striking the additional electrode, and
    wherein the radiation is x-ray radiation.

9. The device according to claim 1, wherein the device is designed as a charge carrier source.

10. The device according to claim 1, wherein the device comprises an arbitrarily selected plurality of or all of the following current sensing elements:
    emission current sensing element;
    extraction current detection element;

electrode current detection element;
charge carrier optical current detection element; and
variation electrode current detection element,
wherein the emission current sensing element comprises at least one resistor and a voltage drop at the emission current sensing element characterizes the emission current,
wherein the extraction current detection element comprises at least one resistor, wherein a voltage drop at the extraction current detection element characterizes the extraction current,
wherein the electrode current detection element comprises at least one resistor, and
wherein a voltage drop at the electrode current detection element characterizes the electrode current.

11. The device according to claim 10, wherein an arbitrarily selected plurality of or all of the following current sensing elements comprises a temperature compensation:
extraction current detection element;
emission current detection element;
electrode current detection element;
charge carrier optical current detection element; and
variation electrode current detection element,
wherein an arbitrarily selected plurality of or all of said current sensing elements comprises a plurality of series-connected resistors, and wherein one of the resistors is a PTC resistor and another of the resistors is an NTC resistor.

12. A method for stabilizing the source current of charge carriers emitted by the field emission element with the device according to claim 1,
wherein the source current is formed by the charge carriers that have already passed the extraction electrode, by the latter the charge carriers have been extracted from the field emission element,
wherein the variable Q, characteristic of the source current, is determined in the method, and
wherein the variable Q is transferred to a regulating device as a controlled quantity.

13. A device for generating a source current of charge carriers by a field emission, the device comprising:
at least one field emission element from which charge carriers emerge during operation of the device, which lead to an emission current in the field emission element and contribute at least partly to the source current of charge carriers;
at least one control element, which is set up to change the emission current; at least one control device, wherein the control device is set up to control the control element;
at least one variation electrode which is set up to change kinetic energy of the extracted charge carriers of the source current by a variation voltage applied to the variation electrode; and
an additional electrode on which the source current of charge carriers impinges at least in part and which contributes to an electrode current in the additional electrode,
wherein the device is designed in such a way that the variation voltage depends on at least one variable K which is a characteristic of the kinetic energy of the extracted charge carriers, and K is a voltage drop at the control element, wherein
the device is designed as an electromagnetic radiation source, wherein the electromagnetic radiation to be emitted by the electromagnetic radiation source is generated by the source current striking the additional electrode, and wherein the electromagnetic radiation is x-ray radiation.

14. The device according to claim 13, further comprising:
at least one extraction electrode for applying an extraction voltage in order to extract the charge carriers from the field emission element,
wherein a first part of the extracted charge carriers contributes to the source current and a second part of the extracted charge carriers impinges on the extraction electrode and leads to an extraction current in the extraction electrode,
wherein the control device is designed, during operation of the device, to reduce fluctuations of a controlled variable Q characteristic for the source current and Q is a function of the electrode current in the additional electrode.

15. The device according to claim 14, wherein the control element is electrically conductively connected to the extraction electrode and is designed for changing the emission current by changing the extraction voltage.

16. The device according to claim 13, wherein K is obtained by the voltage drop on the control element and the device is designed that the variation voltage is increased in the event of a rising voltage drop at the control element and that the variation voltage is reduced when the voltage drop at the control element falls.

17. The device according to claim 13, further comprising an adding element which is conductively connected to the variation electrode, wherein the device is set up in such a way that the variation voltage is obtained by addition from an extraction voltage and the voltage drop at the control element.

18. The device according to claim 13, further comprising a ground connection and an electrical supply power source, wherein the control element is arranged either in a conduction path between the supply power source and the field emission element or in a conduction path between a ground connection and the field emission element.

* * * * *